(12) United States Patent
Toyoshima et al.

(10) Patent No.: US 11,279,876 B2
(45) Date of Patent: Mar. 22, 2022

(54) PHOSPHOR AND LIGHT-EMITTING DEVICE USING SAME

(71) Applicants: DENKA COMPANY LIMITED, Tokyo (JP); NATIONAL INSTITUTE FOR MATERIALS SCIENCE, Tsukuba (JP)

(72) Inventors: Hiroaki Toyoshima, Tokyo (JP); Ryo Yoshimatsu, Tokyo (JP); Taiyo Yamaura, Tokyo (JP); Masato Akabane, Tokyo (JP); Naoto Hirosaki, Tsukuba (JP)

(73) Assignees: DENKA COMPANY LIMITED, Tokyo (JP); NATIONAL INSTITUTE FOR MATERIALS SCIENCE, Tsukuba (JP)

( * ) Notice: Subject to any disclaimer, the term of this patent is extended or adjusted under 35 U.S.C. 154(b) by 0 days.

(21) Appl. No.: 17/040,423

(22) PCT Filed: Mar. 14, 2019

(86) PCT No.: PCT/JP2019/010456
§ 371 (c)(1),
(2) Date: Sep. 22, 2020

(87) PCT Pub. No.: WO2019/188319
PCT Pub. Date: Oct. 3, 2019

(65) Prior Publication Data
US 2021/0017448 A1 Jan. 21, 2021

(30) Foreign Application Priority Data
Mar. 27, 2018 (JP) .............................. JP2018-060207

(51) Int. Cl.
*C09K 11/77* (2006.01)
*C01F 11/02* (2006.01)
(Continued)

(52) U.S. Cl.
CPC .......... *C09K 11/7734* (2013.01); *C01F 11/02* (2013.01); *C09K 11/0883* (2013.01);
(Continued)

(58) Field of Classification Search
CPC ............... C09K 11/7734; H01L 33/502; C01P 2002/76
See application file for complete search history.

(56) References Cited

U.S. PATENT DOCUMENTS 10,519,371 B2 * 12/2019 Seibald ................. H01L 33/502

FOREIGN PATENT DOCUMENTS

| CN | 105400513 A | 3/2016 |
| CN | 10105400513 | * 3/2016 |

(Continued)

OTHER PUBLICATIONS

Translation forCN 105400513, Mar. 16, 16.*
(Continued)

*Primary Examiner* — C Melissa Koslow
(74) *Attorney, Agent, or Firm* — Oliff PLC

(57) ABSTRACT

A phosphor in which an element represented by $R_\delta$ is solid-solutionized in a phosphor host crystal represented by $M_\alpha(L, A)_\beta X_\gamma$, wherein M is at least one type of element selected from Mg, Ca, Sr, Ba and Zn, L is at least one type of element selected from Li, Na and K, A is at least one type of element selected from Al, Ga, B, In, Sc, Y, La and Si, X is at least one type of element selected from O, N, F and Cl (where all of X being N is excluded), R is at least one type of element selected from Mn, Cr, Ti, Ce, Pr, Nd, Sm, Eu, Tb, Dy, Ho and Yb, $\alpha$, $\beta$, $\gamma$ and $\delta$ satisfy $\alpha+\beta+\gamma+\delta=9$, $0.00<\alpha\le1.30$, $3.70\le\beta\le4.30$, $3.70\le\gamma\le4.30$, and $0.00<\delta\le1.30$.

15 Claims, 5 Drawing Sheets

(51) Int. Cl.
C09K 11/08 (2006.01)
H01L 33/50 (2010.01)
(52) U.S. Cl.
CPC ............... C09K 11/77216 (2021.01); C09K 11/77346 (2021.01); H01L 33/502 (2013.01); C01P 2002/76 (2013.01)

(56) References Cited

FOREIGN PATENT DOCUMENTS

| JP | 2005-255895 A | 9/2005 |
|----|----|----|
| JP | 2015-526532 A | 9/2015 |
| WO | 2006/101096 A1 | 9/2006 |
| WO | 2007/066733 A1 | 6/2007 |
| WO | 2013/175336 A1 | 11/2013 |
| WO | WO 2018/087304 * | 5/2018 |

OTHER PUBLICATIONS

Pust et al.; "Narrow-band red-emitting Sr[LiAl3N4]:Eu2+ as a next-generation LED-phosphor material;" Nature Materials; 2014; pp. 891-896; vol. 13.
Jun. 4, 2019 Search Report issued in International Patent Application No. PCT/JP2019/010456.
Sep. 29, 2020 International Preliminary Report on Patentability issued in International Patent Application No. PCT/JP2019/010456.

* cited by examiner

PHOSPHOR AND LIGHT-EMITTING DEVICE USING SAME

TECHNICAL FIELD

The present invention relates to a phosphor, a method of producing a phosphor, and an application of a phosphor.

BACKGROUND ART

Phosphors are used for vacuum-fluorescent displays (VFD), field emission displays (FED), surface-conduction electron-emitter displays (SED), plasma display panels (PDP), cathode-ray tubes (CRT), light-emitting diodes (LED), liquid-crystal display backlights, and the like. In particular, white LEDs which are combinations of near ultraviolet or blue light-emitting semiconductor light emitting elements and phosphors are generally used for applications such as liquid crystal displays and lighting instruments.

In recent years, there has been strong demand for high color reproducibility for liquid crystal displays and LEDs for lighting applications, and accordingly, a phosphor having a full width at half maximum as narrow as possible has been desirable. For example, in white LEDs for liquid crystal display applications, green phosphors and red phosphors having a narrow full width at half maximum have been required, and narrow band green phosphors and narrow red phosphors having a narrow full width at half maximum which satisfy such requirements have been recently reported. In addition, in lighting applications for which high brightness is required, a narrow band yellow phosphor having a narrow full width at half maximum is required.

Regarding an example of a narrow band green phosphor, a green phosphor in which β type sialon is used as a host crystal, and activated with Eu, that is, a β type sialon phosphor is known (refer to Patent Literature 1, in this specification, a crystal such as a β type sialon is referred to as a "phosphor host crystal," or may be simply referred to as a "host crystal"). It is known that, in a β type sialon phosphor, when the content of oxygen is changed while maintaining the crystal structure, the light emission peak wavelength changes toward a shorter wavelength side (for example, refer to Patent Literature 2). In addition, it is known that, when a β type sialon is activated with Ce, it becomes a blue phosphor (for example, refer to Patent Literature 3). In addition, regarding an example of a narrow red phosphor, a phosphor in which $SrLiAl_3N_4$ is used as a phosphor host crystal, and activated with Eu is known (refer to Non-Patent Literature 1).

Here, an element that controls light emission such as Eu and Ce is referred to as an activation element. Generally, the activation element exists in an ionic state in the phosphor, and is solid-solutionized, for example, in the state of $Eu^{2+}$ or $Ce^{3+}$, in the phosphor host crystal.

As described above, the light emission color of the phosphor is determined according to a combination of the phosphor host crystal and the activation element that is solid-solutionized therein. In addition, light emission characteristics such as a light emission spectrum and an excitation spectrum, and chemical stability or thermal stability are determined according to the combination of the phosphor host crystal and the activation element. Therefore, when phosphor host crystals are different or when activation elements are different, the phosphors are regarded as different phosphors. In addition, when the crystal structures of the phosphor host crystals are different even if the chemical compositions are the same, since light emission characteristics and chemical stability are different, the phosphors are regarded as different phosphors.

On the other hand, in many phosphors, while maintaining the crystal structure of the phosphor host crystal, some or all of constituent elements can be replaced with different elements, and thus the light emission color can be changed. For example, a phosphor in which Ce is solid-solutionized in a host crystal of a YAG crystal generally emits green light, but a phosphor in which some of Y is replaced with Gd and some of Al is replaced with Ga in a YAG crystal emits yellow light. In addition, it is known that, in a phosphor in which Eu is solid-solutionized in a phosphor host crystal represented by $CaAlSiN_3$, when some of the Ca is replaced with Sr, the composition can be changed while maintaining the crystal structure, and the light emission peak wavelength can be shortened.

CITATION LIST

Patent Literature

[Patent Literature 1] Japanese Unexamined Patent Publication No. 2005-255895

[Patent Literature 2] PCT International Publication No. WO 2007/066733

[Patent Literature 3] PCT International Publication No. WO 2006/101096

[Non-Patent Literature 1] NATURE MATERIALS VOL 13 Sep. 2014

SUMMARY OF INVENTION

Technical Problem

A main objective of the present invention is to provide a novel phosphor. In addition, an objective of the present invention is to provide a light-emitting element, light-emitting device, and image display device containing the novel phosphor.

Solution to Problem

The inventors investigated a novel phosphor and studied regarding characteristics of the obtained phosphor in detail, and as a result, found a novel phosphor in which a specific activation element is solid-solutionized in a phosphor host crystal which contains a specific element and is represented by a specific composition formula, and also found a method of producing the same, and thus completed the present invention.

In addition, it is possible to provide a light-emitting element, a light-emitting device, and an image display device containing the phosphor of the present invention.

(1) Specifically, the present invention is a phosphor in which an element represented by $R_\delta$ is solid-solutionized in a phosphor host crystal represented by $M_\alpha(L, A)_\beta X_\gamma$, wherein, M is at least one type of element selected from Mg, Ca, Sr, Ba and Zn, L is at least one type of element selected from Li, Na and K, A is at least one type of element selected from Al, Ga, B, In, Sc, Y, La and Si, X is at least one type of element selected from O, N, F and Cl (where all of X being N is excluded), R is at least one type of element selected from Mn, Cr, Ti, Ce, Pr, Nd, Sm, Eu, Tb, Dy, Ho and Yb, and $\alpha$, $\beta$, $\gamma$ and $\delta$ satisfy $\alpha+\beta+\gamma+\delta=9$, $0.00<\alpha\leq1.30$, $3.70\leq\beta\leq4.30$, $3.70\leq\gamma\leq4.30$, and $0.00<\delta\leq1.30$.

Here, in the composition formula of the phosphor, O, that is, oxygen, does not include having an oxygen content on the surface of the phosphor. This is similarly interpreted in this specification.

(2) In addition, in the present invention, in the phosphor host crystal, preferably, M is at least one type of element selected from Mg, Ca, Sr, Ba and Zn, some or all of L is elemental Li, some or all of A is at least one type of element selected from Al, Ga and Si, X is one type or two types of elements t selected from O and N (where all of X being N is excluded), and R is at least one type of element selected from Mn, Cr, Ti, Ce, Pr, Nd, Sm, Eu, Tb, Dy, Ho and Yb.

(3) In addition, in the present invention, preferably, the phosphor host crystal is represented by any of the following composition formulae:
$SrLi_{3-p}Al_{1+p}O_{4-2p}N_{2p}$, $MgLi_{3-p}Al_{1+p}O_{4-2p}N_{2p}$, $CaLi_{3-p}Al_{1+p}O_{4-2p}N_{2p}$, $BaLi_{3-p}Al_{1+p}O_{4-2p}N_{2p}$, $(Ca, Mg)Li_{3-p}Al_{1+p}O_{4-2p}N_{2p}$, $(Sr, Ca)Li_{3-p}Al_{1+p}O_{4-2p}N_{2p}$, $(Sr, Ba)Li_{3-p}Al_{1+p}O_{4-2p}N_{2p}$, $SrLi_{3-p}Ga_{1+p}O_{4-2p}N_{2p}$, $MgLi_{3-p}Ga_{1+p}O_{4-2p}N_{2p}$, $CaLi_{3-p}Ga_{1+p}O_{4-2p}N_{2p}$, and $BaLi_{3-p}Ga_{1+p}O_{4-2p}N_{2p}$ (where, $0 \leq p < 2.0$). Herein, when two elements are included in the same parenthesis in a given formula, both elements are present.

(4) In addition, in the present invention, the phosphor host crystal may be a triclinic type crystal and have space group P-1 symmetry.

(5) In addition, in the present invention, preferably, lattice constants a, b and c of the phosphor host crystal are values in ranges:
a=0.5752±0.05 nm,
b=0.7341±0.05 nm, and c=0.9738±0.05 nm.

Here, "±0.05" indicates an allowable numerical value range, and for example, indicates a range of $0.5752-0.05 \leq a \leq 0.5752+0.05$ for a. This is similarly interpreted in this specification.

(6) In addition, in the present invention, preferably, the phosphor may be represented by a composition formula $Sr_eLi_fAl_gO_{h1}N_{h2}R_i$, and compositional proportions e, f, g, h1, h2 and i satisfy e+f+g+h1+h2+i=9, $0.00 < e \leq 1.30$, $0.70 \leq f \leq 3.30$, $0.70 \leq g \leq 3.30$, $3.70 \leq h1+h2 \leq 4.30$ (where, h1>0), and $0.00 < i \leq 1.30$.

(7) In addition, in the present invention, preferably, the compositional proportions e, f, g, h1 and h2 satisfy e+i=1.00±0.30, f+g=4.00±0.30, and h1+h2=4.00±0.30 (where, h1>0).

(8) In addition, in the phosphor of the present invention, preferably, the compositional proportions f and g satisfy $\frac{1}{4} \leq g/(f+g) < \frac{3}{4}$.

(9) In addition, in the phosphor of the present invention, preferably, the compositional proportions h1 and h2 satisfy $0 < h1/(h1+h2) \leq 1$.

(10) In the phosphor of the present invention, preferably, when light having a light intensity peak in a wavelength range of 250 nm or more and 500 nm or less is irradiated, the phosphor emits fluorescence having a light intensity peak in a wavelength range of 430 nm or more and 670 nm or less.

(11) In addition, in the present invention, preferably, when light having a light intensity peak in a wavelength range of 250 nm or more and 500 nm or less is irradiated, the phosphor emits fluorescence having a light intensity peak in a wavelength range of 560 nm or more and 580 nm or less.

(12) In addition, in the present invention, preferably, the elements represented by R include Eu.

(13) In addition, in the present invention, preferably, the phosphor may be represented by a composition formula $Sr_{1-r}Li_{3-q}Al_{1+q}O_{4-2q}N_{2q}Eu_r$, and parameters q and r satisfy $0 \leq q < 2.0$, and $0 < r < 1.0$.

(14) In addition, in the present invention, preferably, the parameters q and r satisfy q=0, and 0<r<0.05.

(15) The present invention is a method of producing the phosphor according to (1), including:
mixing at least a raw material containing M, a raw material containing L, a raw material containing A, a raw material containing X, and a raw material containing R
(where, M is at least one type of element selected from Mg, Ca, Sr, Ba and Zn, L is at least one type of element selected from Li, Na and K, A is at least one type of element selected from Al, Ga, B, In, Sc, Y, La and Si, R is at least one type of element selected from Mn, Cr, Ti, Ce, Pr, Nd, Sm, Eu, Tb, Dy, Ho and Yb, and X is at least one type of element selected from O, N, F and Cl (where all of X being N is excluded)) to prepare a raw material mixture; and
calcining the raw material mixture in a temperature range of 600° C. or higher and 1,500° C. or lower.

Here, each raw material containing M, L, A, X, or R may be a single substance or a compound.

(16) In addition, the present invention provides a light-emitting element including the phosphor according to any one of (1) to (14).

(17) In addition, the present invention provides a light-emitting device using the light-emitting element.

(18) In addition, the present invention provides an image display device using the light-emitting element.

Advantageous Effects of Invention

According to implementation of the present invention, it is possible to obtain a novel phosphor, that is, a phosphor in which an element represented by $R_\delta$ is solid-solutionized in a phosphor host crystal represented by $M_\alpha(L, A)_\beta X_\gamma$, M is at least one type of element selected from Mg, Ca, Sr, Ba and Zn, L is at least one type of element selected from Li, Na and K, A is at least one type of element selected from Al, Ga, B, In, Sc, Y, La and Si, X is at least one type of element selected from O, N, F and Cl (where all of X being N is excluded), R is at least one type of element selected from Mn, Cr, Ti, Ce, Pr, Nd, Sm, Eu, Tb, Dy, Ho and Yb, $\alpha$, $\beta$, $\gamma$ and $\delta$ satisfy $\alpha+\beta+\gamma+\delta=9$, $0.00<\alpha\leq1.30$, $3.70\leq\beta\leq4.30$, $3.70\leq\gamma\leq4.30$, and $0.00<\delta\leq1.30$.

When the novel phosphor of the present invention is used, it is possible to obtain a light emission color having a high color purity, and thus it is assumed that the phosphor may be suitably used for a light-emitting element such as a white light-emitting diode or a phosphor plate, and moreover, a light-emitting element containing the phosphor of the present invention may be suitably used for a light-emitting device such as a lighting instrument and a liquid crystal backlight light source, and an image display device such as a YFD, FED, PDF, and CRT. In addition, the phosphor of the present invention absorbs ultraviolet rays and thus is suitably used as a material for a pigment and a UV absorbing agent. In addition, for example, it is possible to obtain a molded article such as a fluorescent molded article, a fluorescent sheet or a fluorescent film which is obtained by additionally molding a resin composition containing the phosphor of the present invention.

Here, the effects described here are not necessarily limiting, and any effect described in the present technology may be obtained.

DESCRIPTION OF EMBODIMENTS

Figure 1:
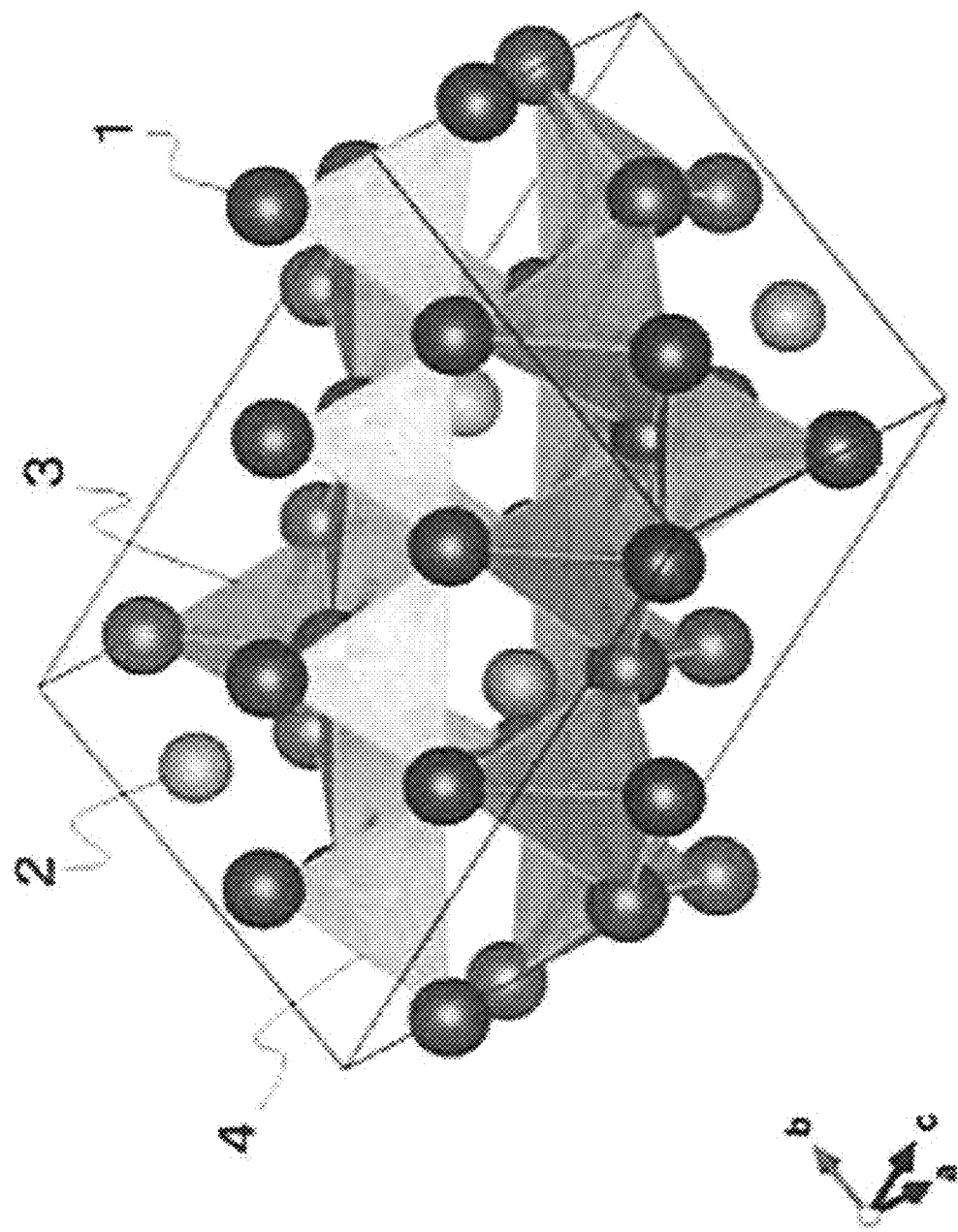
FIG. 1 is a diagram showing a crystal structure of a $SrLi_3AlO_4$ crystal.

Embodiments of the present invention will be described below. However, although the embodiments described below show representative embodiments of the present technology, the scope of the present technology should not be narrowly understood based on the embodiments.

<1. Phosphor>

A phosphor host crystal for a phosphor of the present invention is represented by $M_\alpha(L, A)_\beta X_\gamma$, and in the phosphor of the present invention, an element represented by $R_\delta$ is solid-solutionized in the phosphor host crystal.

Here, in the phosphor host crystal, M is at least one type of element selected from Mg, Ca, Sr, Ba and Zn, L is at least one type of element selected from Li, Na and K, A is at least one type of element selected from Al, Ga, B, In, Sc, Y, La and Si, X is at least one type of element selected from O, N, F and Cl (where all of X being N is excluded), R is at least one type of element selected from Mn, Cr, Ti, Ce, Pr, Nd, Sm, Eu, Tb, Dy, Ho and Yb, α, β, γ and δ satisfy α+β+γ+δ=9, 0.00<α≤1.30, 3.70≤β≤4.30, 3.70≤γ≤4.30, and 0.00<δ≤1.30.

Here, in the process until the present invention was completed, the inventors conducted extensive studies regarding synthesis of a substance represented by a composition formula $SrLi_3AlO_4$ from respective raw materials containing elemental Sr, elemental Li, elemental Al, and elemental O, and found that the substance synthesized is not a mixture, but is a single substance having a crystal structure having $SrLi_3AlO_4$ as a unit according to crystal structure analysis, which had not been reported before the present invention. In addition, they confirmed that a crystal structure the same as that of an $SrLi_3AlO_4$ crystal is maintained not only when an $SrLi_3AlO_4$ crystal is renewed but also when some or all of elements thereof are replaced with other specific elements, and based on this, confirmed that a composition formula thereof could be represented by the symbols M, L, A and X as a crystal of $M_\alpha(L, A)_\beta X_\gamma$ (where, M is at least one type of element selected from Mg, Ca, Sr, Ba and Zn, L is at least one type of element selected from Li, Na and K, A is at least one type of element selected from Al, Ga, B, In, Sc, Y, La and Si, and X is at least one type of element selected from O, N, F, and Cl (where all of X being N is excluded)).

In addition, a crystal in which an element represented by $R_\delta$ (where, R is at least one type of element selected from Mn, Cr, Ti, Ce, Pr, Nd, Sm, Eu, Tb, Dy, Ho and Yb, and also, α, β, γ and δ satisfy α+β+γ+δ=9, and δ satisfies 0.00<δ≤1.30) is solid-solutionized in an $M_\alpha(L, A)_\beta X_\gamma$ crystal has the same crystal structure as an $M_\alpha(L, A)_\beta X_\gamma$ crystal and also emits fluorescence. Therefore, a crystal represented by the composition formula $M_\alpha(L, A)_\beta X_\gamma$ is a novel phosphor host crystal, that is, a novel phosphor in which an element represented by $R_\delta$ is solid-solutionized in the phosphor host crystal represented by the composition formula $M_\alpha(L, A)_\beta X_\gamma$ was found, and thus the present invention was completed.

Table 1 shows results of X-ray crystal structure analysis of an $SrLi_3AlO_4$ crystal, which resulted in completion of the present invention.

TABLE 1

| Crystal composition | | $SrLiAl_3O_4$ | |
|---|---|---|---|
| Formula weight (Z) | | 4 | |
| Crystal type | | Triclinic type | |
| Space group | | P-1 | |
| Space group number | | 2 | |
| Lattice constants | a | 0.5752 | nm |
| | b | 0.7341 | nm |
| | c | 0.9738 | nm |
| | α | 83.930 | degree |
| | β | 76.693 | degree |
| | γ | 79.660 | degree |

| Space of atom | Atomic coordinates | | | Occupancy |
|---|---|---|---|---|
| | x | y | z | |
| Sr (1) | 0.0077 | 0.6215 | 0.1180 | 1 |
| Sr (2) | 0.0281 | 0.1331 | 0.6238 | 1 |
| Li, Al (1) | −0.5408 | 0.7873 | 0.1353 | 1 |
| Li, Al (2) | −0.1610 | 0.3047 | 0.3464 | 1 |
| Li, Al (3) | 0.5380 | 0.4300 | 0.1310 | 1 |
| Li, Al (4) | 0.1850 | 0.4440 | 0.3980 | 1 |
| Li, Al (5) | 0.1800 | 0.9390 | −0.1000 | 1 |
| Li, Al (6) | −0.5430 | 1.0490 | 0.3740 | 1 |
| Li, Al (7) | −0.4710 | 0.6850 | 0.3840 | 1 |
| Li (8) | 0.1910 | 1.1760 | 0.1480 | 1 |
| O (1) | −0.3539 | 0.6579 | −0.0071 | 1 |
| O (2) | −0.1602 | 0.3031 | 0.1623 | 1 |
| O (3) | 0.1878 | 0.9288 | 0.0991 | 1 |
| O (4) | 0.3438 | −0.1595 | 0.5337 | 1 |
| O (5) | 0.3326 | 0.6140 | 0.2622 | 1 |
| O (6) | 0.1420 | 0.1892 | 0.3581 | 1 |
| O (7) | −0.3571 | 0.8848 | 0.2253 | 1 |
| O (8) | −0.1720 | 0.5350 | 0.3955 | 1 |

In Table 1, lattice constants a, b, and c indicate a length of an axis of a unit lattice of the $SrLi_3AlO_4$ crystal, and α, β, and γ indicate an angle between axes of a unit lattice. In addition, in Table 1, atomic coordinates x, y, and z indicate the position of each atom in the unit lattice as a value between 0 and 1 in units of unit lattices. In the crystal, when there are Sr, Li, Al, and O atoms, an analysis result in which Sr exists in two types of the same spaces (Sr(1) to Sr(2)) is obtained. In addition, an analysis result in which Li and Al exist in seven types of same spaces (Li, Al(1) to Li, Al(7)) is obtained. An analysis result in which Li exists in one type of the same space (Li(8)) is obtained. In addition, an analysis result in which O exists in eight types of same spaces is obtained.

FIG. 1 shows a crystal structure of the $SrLi_3AlO_4$ crystal. In FIG. 1, 1 indicates an O atom positioned at the apex of a tetrahedron. 2 indicates a Sr atom positioned between tetrahedrons. 3 indicates an $AlO_4$ tetrahedron whose center is an Al atom. 4 indicates a $LiO_4$ tetrahedron whose center is a Li atom. That is, the $SrLi_3AlO_4$ crystal is a triclinic type crystal and has the P-1 space group ($2^{nd}$ space group of International Tables for Crystallography). Here, in this crystal, an element represented by R, for example, Eu, is a so-called activation element having a function of emitting light, and is incorporated into the crystal in a form in which it substitutes some of Sr.

The above results were not known as known technical information before the phosphor of the present invention was found, that is, the phosphor of the present invention in which $R_\delta$ is solid-solutionized in a phosphor host crystal having a composition formula represented by $M_\alpha(L, A)_\beta X_\gamma$ is a novel phosphor.

In addition, in a crystal having a composition formula represented by $M_\alpha(L, A)_\beta X_\gamma$, that is, in a crystal in which some or all elements of the $SrLi_3AlO_4$ crystal are replaced with other elements, and as will be described below, an activation element such as Eu is additionally solid-solutionized therein, although the lattice constants of the $SrLi_3AlO_4$ crystal shown in Table 1 vary, the basic crystal structure, spaces occupied by atoms, and atom positions assigned by the coordinates do not change to an extent that the chemical bonds between skeletal atoms break, and the crystal structure does not change.

That is, the above description "the same crystal structure as an $SrLi_3AlO_4$ crystal is maintained not only in the $SrLi_3AlO_4$ crystal, but also, even if some or all elements are replaced with other specific elements," means that, regarding X-ray diffraction or neutron diffraction results of a crystal having a composition formula represented by $M_\alpha(L, A)_\beta X_\gamma$, the lattice constant obtained by Rietvelt analysis in the P-1 space group and the length of the chemical bond between Al and O and between Li and O (distance between adjacent atoms) calculated from atomic coordinates should be within ±5% of the lattice constant of the $SrLi_3AlO_4$ crystal shown in Table 1 and the length of the chemical bond calculated from atomic coordinates. In this case, when the length of the chemical bond changes by more than ±5%, it can be experimentally confirmed that the chemical bonds have broken and another crystal has been formed.

In the $M_\alpha(L, A)_\beta X_\gamma$ crystal according to the present invention, for example, in the $SrLi_3AlO_4$ crystal shown in FIG. 1, an element represented by the symbol M can enter a space in which Sr is present, elements represented by the symbols L and A can enter spaces in which Li and Al are present, and an element represented by the symbol X can enter a space in which O is present. According to this feature, while maintaining the crystal structure of $SrLi_3AlO_4$, it is possible to make a ratio between the numbers of atoms such that, with respect to one M atom, a total number of L and A atoms is 4, and a total number of X atoms is 4. In addition, an element represented by R can enter a space in which Sr is present. However, it is desirable that a total amount of positive charge indicated by elements represented by M, L, A, and R, and a total amount of negative charge indicated by X cancel each other out and electrical neutrality of the entire crystal be maintained.

Figure 2:
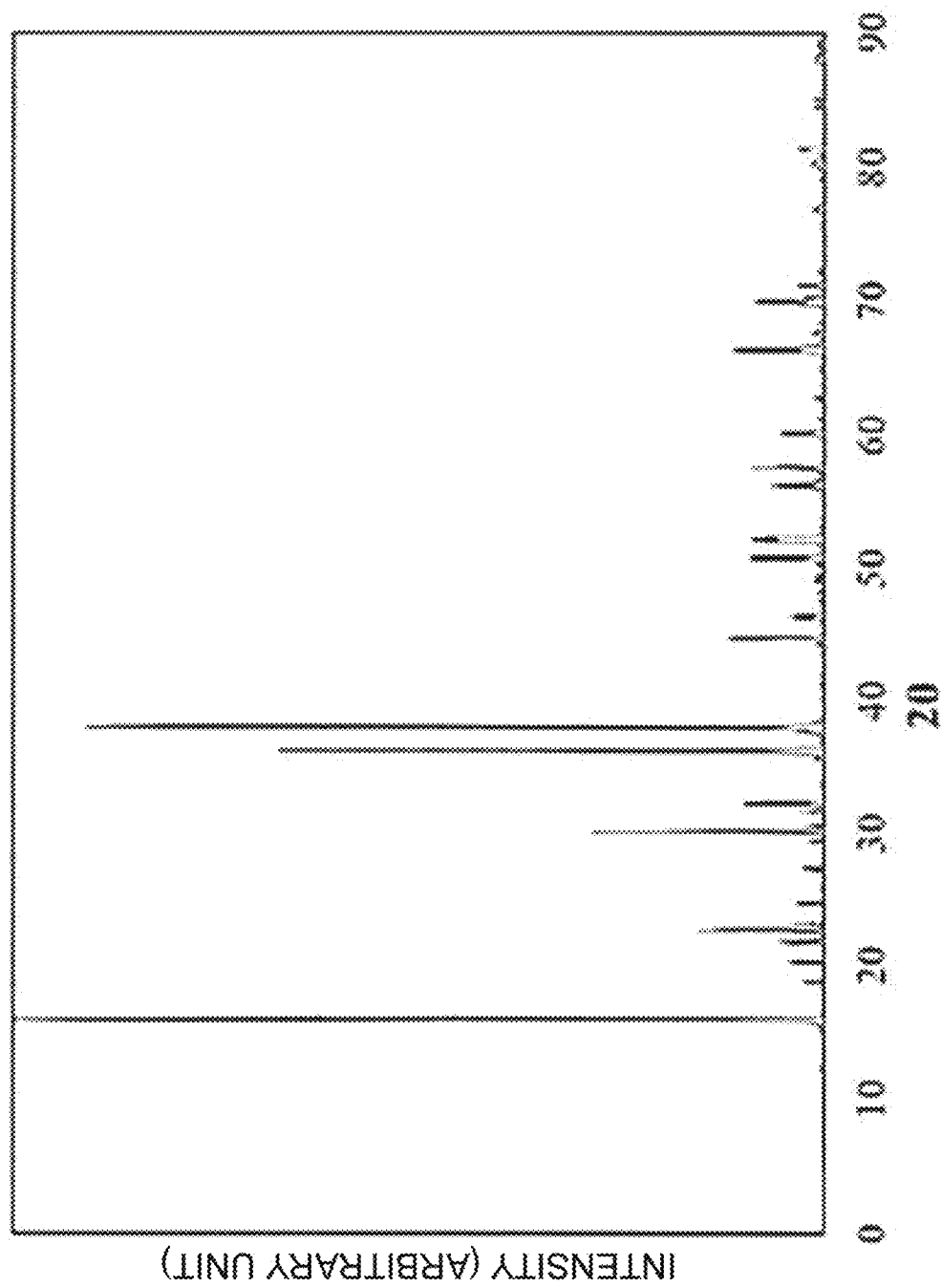
FIG. 2 is a diagram showing powder X-ray diffraction using CuKα rays calculated from the crystal structure of the $SrLi_3AlO_4$ crystal.

FIG. 2 shows a peak pattern of powder X-ray diffraction using CuKα rays calculated from the crystal structure of the $SrLi_3AlO_4$ crystal based on numerical values shown in Table 1.

Here, the following method can be preferably used as a simple method for determining whether a crystal having an unknown crystal structure has the same crystal structure as an $SrLi_3AlO_4$ crystal. Specifically, in this method, regarding a crystal having an unknown crystal structure which is a determination subject, when the position (2θ) of the measured X-ray diffraction peak and the peak position of the diffraction shown in FIG. 2 coincide with each other with respect to the main peak, it is determined that both crystal structures are the same, that is, it is determined that the crystal structure of the crystal having an unknown crystal structure has the same crystal structure as an $SrLi_3AlO_4$ crystal. Regarding the main peak, about 10 peaks having a high diffraction intensity may be used for determination. In the present invention, this determination method is used in examples.

As described above, the phosphor of the present invention is a phosphor in which an element represented by $R_\delta$ is solid-solutionized in the phosphor host crystal represented by $M_\alpha(L, A)_\beta X_\gamma$, some or all of L is elemental Li, some or all of A is at least one type of element selected from Al, Ga and Si, and X may be one type or two types of elements selected from O and N (where all of X being N is excluded).

Here, in conventional phosphor production, when a raw material containing elemental N, that is, a nitride, is used, a phosphor containing a small amount of elemental O derived from the raw material is produced. However, in the present invention, as will be described below, a phosphor is produced using a raw material containing elemental O, that is, an oxide. This production method is not limited to a method of producing a phosphor using only an oxide, and a nitride may be used, but a phosphor using only a nitride is not produced. Therefore, not all X of the phosphor host crystal represented by $M_\alpha(L, A)_\beta X_\gamma$ are replaced with elemental N.

In the phosphor of the present invention, a phosphor host crystal having a composition formula represented by $M_\alpha(L, A)_\beta X_\gamma$ may be represented by a composition formula which is any combination of the above elements, but a phosphor host crystal which is more specifically shown by the following exemplified composition formula using a parameter p (where, 0≤p<2.0) is preferable. That is, the phosphor host crystal of the present invention is preferably, for example, $SrLi_{3-p}Al_{1+p}O_{4-2p}N_{2p}$, $MgLi_{3-p}Al_{1+p}O_{4-2p}N_{2p}$, $CaLi_{3-p}Al_{1+p}O_{4-2p}N_{2p}$, $BaLi_{3-p}Al_{1+p}O_{4-2p}N_{2p}$, $ZnLi_{3-p}Al_{1+p}O_{4-2p}N_{2p}$, (Ca, Mg)$Li_{3-p}Al_{1+p}O_{4-2p}N_{2p}$, (Sr, Ca)$Li_{3-p}Al_{1+p}O_{4-2p}N_{2p}$, (Sr, Ba)$Li_{3-p}Al_{1+p}O_{4-2p}N_{2p}$, $SrLi_{3-p}Ga_{1+p}O_{4-2p}N_{2p}$, $MgLi_{3-p}Ga_{1+p}O_{4-2p}N_{2p}$, $CaLi_{3-p}Ga_{1+p}O_{4-2p}N_{2p}$, $BaLi_{3-p}Ga_{1+p}O_{4-2p}N_{2p}$, $ZnLi_{3-p}Ga_{1+p}O_{4-2p}N_{2p}$, $SrLi_{3-p}$(Al, Ga)$_{1+p}O_{4-2p}N_{2p}$, $MgLi_{3-p}$(Al, Ga)$_{1+p}O_{4-2p}N_{2p}$, $CaLi_{3-p}$(Al, Ga)$_{1+p}O_{4-2p}N_{2p}$, $BaLi_{3-p}$(Al, Ga)$_{1+p}O_{4-2p}N_{2p}$, $ZnLi_{3-p}$(Al, Ga)$_{1+p}O_{4-2p}N_{2p}$, $SrLi_{3-p}$(Al, Si)$_{1+p}O_{4-2p}N_{2p}$, $MgLi_{3-p}$(Al, Si)$_{1+p}O_{4-2p}N_{2p}$, $CaLi_{3-p}$(Al, Si)$_{1+p}O_{4-2p}N_{2p}$, $BaLi_{3-p}$(Al, Si)$_{1+p}O_{4-2p}N_{2p}$, $ZnLi_{3-p}$(Al, Si)$_{1+p}O_{4-2p}N_{2p}$, $SrLi_{2-p}$(Ga, Si)$_{1+p}O_{4-2p}N_{2p}$, $MgLi_{3-p}$(Ga, Si)$_{1+p}O_{4-2p}N_{2p}$, $CaLi_{3-p}$(Ga, Si)$_{1+p}O_{4-2p}N_{2p}$, $BaLi_{3-p}$(Ga, Si)$_{1+p}O_{4-2p}N_{2p}$, or $ZnLi_{3-p}$(Ga, Si)$_{1+p}O_{4-2p}N_{2p}$ (where, 0≤p<2.0, and preferably 0≤p<1.95). When a light emission intensity of the phosphor is changed or the hue is desired to be controlled, the crystal may be appropriately selected from fluorescent host crystals represented by these composition formulae.

In order to obtain a phosphor having a higher light emission intensity, it is preferable that a phosphor host crystal represented by $M_\alpha(L, A)_\beta X_\gamma$ be stably generated. Examples of candidates for a phosphor host crystal for obtaining such a phosphor include those represented by composition formulae such as $SrLi_{3-p}Al_{1+p}O_{4-2p}N_{2p}$, $MgLi_{3-p}Al_{1+p}O_{4-2p}N_{2p}$, $CaLi_{3-p}Al_{1+p}O_{4-2p}N_{2p}$, $BaLi_{3-p}Al_{1+p}O_{4-2p}N_{2p}$, (Ca, Mg)$Li_{3-p}Al_{1+p}O_{4-2p}N_{2p}$, (Sr, Ca)$Li_{3-p}Al_{4+p}O_{4-2p}N_{2p}$, (Sr, Ba)$Li_{3-p}Al_{1+p}O_{4-2p}N_{2p}$, $SrLi_{3-p}Ga_{1+p}O_{4-2p}N_{2p}$, $MgLi_{3-p}Ga_{1+p}O_{4-2p}N_{2p}$, $CaLi_{3-p}Ga_{1+p}O_{4-2p}N_{2p}$ or $BaLi_{3-p}Ga_{1+p}O_{4-2p}N_{2p}$ (where, 0≤p<2.0, and preferably 0≤p<1.95).

In addition, in the phosphor of the present invention, the phosphor host crystal may be a triclinic type crystal and have space group P-1 symmetry.

In addition, in the phosphor of the present invention, lattice constants a, b and c of the phosphor host crystal are preferably values in ranges:
a=0.5752±0.05 nm,
b=0.7341±0.05 nm, and
c=0.9738±0.05 nm.

In addition, the phosphor of the present invention is represented by a composition formula of $Sr_eLi_fAl_gO_{h1}N_{h2}R_i$, and compositional proportions e, f, g, h1, h2 and i preferably satisfy:
e+f+g+h1+h2+i=9,
0.00<e≤1.30,
0.70≤f≤3.30,
0.70≤g≤3.30,
3.70≤h1+h2≤4.30 (where, h1>0), and
0.00<i≤1.30.

It is thought that, in such a compositional proportion, a phosphor host crystal is stably generated, and a phosphor having a higher light emission intensity is obtained.

The compositional proportion e is a parameter indicating a compositional proportion of Sr, and when the compositional proportion e is 1.30 or less, the crystal structure becomes stable, and decrease in the light emission intensity can be minimized.

The compositional proportion f is a parameter indicating a compositional proportion of Li, and when the compositional proportion f is 0.70 or more and 3.30 or less, the crystal structure does not become unstable, and decrease in the light emission intensity can be minimized.

The compositional proportion g is a parameter indicating a compositional proportion of Al, and when the compositional proportion g is 0.70 or more and 3.30 or less, the crystal structure does not become unstable, and decrease in the light emission intensity can be minimized.

The compositional proportions h1 and h2 are parameters indicating compositional proportions of O and N, and when h1+h2 is 3.70 or more and 4.30 or less (where, h1>0), the crystal structure of the phosphor does not become unstable, and decrease in the light emission intensity can be minimized.

The compositional proportion i is a parameter indicating a compositional proportion of the activation element R such as Eu, and when i exceeds 0.00, decrease in brightness due to an insufficient amount of activation elements can be minimized. Here, when i is 1.30 or less, it is possible to maintain the structure of the phosphor host crystal sufficiently. When i exceeds 1.30, the structure of the phosphor host crystal may become unstable. In addition, when i is 1.30 or less, this is preferable because decrease in the light emission intensity due to a concentration quenching phenomenon caused by an interaction between activation elements can be minimized.

In addition, the compositional proportions e, f, g, h1 and h2 are preferably as follows:
e+i=1.00±0.30,
f+g=4.00±0.30, and
h1+h2=4.00±0.30 (where, h1>0).

It is thought that, in such a compositional proportion, a phosphor host crystal is stably generated, and a phosphor having a higher light emission intensity is obtained.

In addition, it is thought that a phosphor in which the compositional proportions f and g satisfy 1/4≤g/(f+g)<3/4 is preferable because in this case the crystal structure is stable, and the light emission intensity is particularly high.

In addition, it is thought that a phosphor in which the compositional proportions h1 and h2 satisfy 0<h1/(h1+h2)≤1 is preferable because in this case the crystal structure is more stable, and the light emission intensity is high.

In addition, for example, when light having a light intensity peak in a wavelength range of 250 nm or more and 500 nm or less is irradiated, the phosphor of the present invention can emit fluorescence having a light intensity peak in a wavelength range of 430 nm or more and 670 nm or less.

Particularly preferably, when light having a light intensity peak in a wavelength range of 250 nm or more and 500 nm or less is irradiated, the phosphor of the present invention can emit fluorescence having a light intensity peak in a wavelength range of 560 nm or more and 580 nm or less.

The phosphor of the present invention is a phosphor in which R (where, R is at least one type of element selected from Mn, Cr, Ti, Ce, Pr, Nd, Sm, Eu, Tb, Dy, Ho and Yb) is solid-solutionized as an activation element in the phosphor host crystal, and Eu can be preferably selected as the activation element R. A phosphor containing Eu as the activation element R is a phosphor having a high light emission intensity in the present invention, and a phosphor that emits blue to red fluorescence in a range of 430 nm or more and 670 nm or less is obtained with a specific composition.

Particularly preferably, the phosphor of the present invention is a phosphor which is represented by a composition formula $Sr_{1-r}Li_{3-q}Al_{1+q}O_{4-2q}N_{2q}Eu_r$, in which the parameters q and r satisfy 0≤q<2.0, and 0<r<1.0.

While maintaining a stable crystal structure of the phosphor represented by the composition formula, when the Eu/Sr ratio, the Li/Al ratio, and the N/O ratio are changed by appropriately changing values of parameters q and r, it is possible to continuously change the excitation peak wavelength and the light emission peak wavelength of the phosphor.

When the light emission peak wavelength of the phosphor changes, the color of light emitted when excitation light is irradiated can be a value of (x, y) in CIE 1931 chromaticity coordinates, for example, a range of 0≤x≤0.8 and 0≤y≤0.9. Such a phosphor is preferably used as, for example, a phosphor for a white LED, because it can emit blue to red light.

Here, the phosphor of the present invention is, for example, a phosphor that absorbs energy of vacuum ultraviolet rays, ultraviolet rays, visible light, or radioactive rays as an excitation source having a wavelength of 100 nm or more and 500 nm or less and emits light. Examples of radioactive rays include X rays, γ rays, α rays, β rays, electron rays, and neutron rays, but the radioactive rays are not particularly limited. When these excitation sources are used, the phosphor of the present invention can efficiently emit light.

In addition, when the light emission peak wavelength is controlled such that it is 550 nm to 550 nm, preferably 550 nm to 630 nm, and more preferably 550 nm to 590 nm, if the excitation light is in a range of 380 nm to 450 nm, it is preferable that the above parameters q and r satisfy q=0 and 0<r<0.05.

The phosphor of the present invention is preferably single crystal particles of the phosphor of the present invention, particles in which single crystals of the phosphor of the present invention are aggregated, or a mixture thereof. It is desirable that the phosphor of the present invention be as pure as possible. However, substances other than the phosphor of the present invention, for example, impurities other than the phosphor of the present invention, which are inevitably contained, may be contained as long as light emission of the phosphor is not impaired.

For example, there is a risk of impurity elements Fe, Co and Ni contained in the raw materials and a calcining container decreasing the light emission intensity of the phosphor. In this case, when a total amount of these impurity elements in the phosphor is set to 500 ppm or less, an influence on decrease in the light emission intensity is weakened.

In addition, when the phosphor of the present invention is produced, a compound having a crystal phase other than that of the phosphor of the present invention or an amorphous phase (also referred to as a sub-phase) may be generated at the same time. The sub-phase does not necessarily have the same composition as the phosphor of the present invention. The phosphor of the present invention preferably contains as little sub-phase as possible, but may contain a sub-phase as long as light emission of the phosphor is not impaired.

That is, regarding one embodiment of the present invention, the phosphor of the present invention is a phosphor in which the crystal represented by the above $M_\alpha(L, A)_\beta X_\gamma$ is used as a phosphor host crystal, and which includes a compound in which an activation element $R_\delta$ in an ionic state is solid-solutionized and a mixture with other crystal phases such as a sub-phase which is different from that of the compound, and the content of the compound is 20 mass % or more.

When desired characteristics cannot be obtained with a phosphor alone of a crystal represented by $M_\alpha(L, A)_\beta X_\gamma$, the above embodiment may be used. The content of the phosphor host crystal represented by $M_\alpha(L, A)_\beta X_\gamma$ may be adjusted according to desired characteristics, and when the content is 20 mass % or more, light emission intensity is sufficient. In this regard, in the phosphor of the present invention, it is preferable that the above compound include 20 mass % or more of a phosphor host crystal as a main component. Such a phosphor can emit fluorescence having a peak in a wavelength range of 400 nm to 670 nm when an excitation source is used for emission.

In addition, the form of the phosphor of the present invention is not particularly limited, and when dispersed particles are used as the phosphor, for example, single crystal particles having an average particle size of 0.1 µm or more and 30 µm or less or particles in which single crystals are aggregated are preferable. When the particle size is controlled such that it is within the above range, the light emission efficiency is high and the operability is favorable when mounted in an LED. The average particle size is a volume-based median diameter (d50) calculated from a particle size distribution (cumulative distribution) measured using a particle size distribution measurement device using a laser diffraction and scattering method as a measurement principle, which is defined in JIS Z8825 (2013). In addition, the phosphor of the present invention can be sintered again and used in a non-particle shape. In particular, a plate-like sintered component containing a phosphor is generally called a phosphor plate, and can be preferably used, for example, as a light-emitting member of a light-emitting element.

<2. Method of Producing Phosphor>

The method of producing a phosphor of the present invention is also one embodiment of the present invention.

The method of producing a phosphor includes mixing at least a raw material containing M, a raw material containing L, a raw material containing A, a raw material containing X, and a raw material containing R (where, M is at least one type of element selected from Mg, Ca, Sr, Ba and Zn, L is at least one type of element selected from Li, Na and K, A is at least one type of element selected from Al, Ga, B, In, Sc, Y, La and Si, R is at least one type of element selected from Mn, Cr, Ti, Ce, Pr, Nd, Sm, Eu, Tb, Dy, Ho and Yb, and X is at least one type of element selected from O, N, L and Cl (where all of X being N is excluded)) to prepare a raw material mixture; and calcining the raw material mixture in a temperature range of 600° C. or higher and 1,500° C. or lower.

Here, when the raw material is a compound, one compound may contain a plurality of elements M, L, A, X and R or the raw material may be a single substance, that is, a substance formed of a single element.

The raw material containing M may be a single substance selected from metals including at least one type of element selected from Mg, Ca, Sr, Ba and Zn, oxides, carbonates, hydroxides, oxynitrides, nitrides, hydrides, fluorides and chlorides or a mixture of two or more thereof, and specifically, an oxide is preferably used.

The raw material containing L is a single substance selected from metals containing at least one type of element selected from Li, Na and K, oxides, carbonates, hydroxides, oxynitrides, nitrides, hydrides, fluorides and chlorides or a mixture of two or more thereof, and specifically, an oxide is preferably used.

The raw material containing A is a single substance selected from metals containing at least one type of element selected from Al, Ga, B, In, Sc, Y, La and Si, oxides, carbonates, hydroxides, oxynitrides, nitrides, hydrides, fluorides and chlorides or a mixture of two or more thereof, and specifically, an oxide is preferably used.

The raw material containing R is a single substance selected from metals containing at least one type of element selected from Mn, Cr, Ti, Ce, Pr, Nd, Sm, Eu, Tb, Dy, Ho and Yb, oxides, nitrides, fluorides and chlorides or a mixture of two or more thereof, and specifically, europium oxide is preferably used. The raw materials are preferably in a powder form.

The raw material containing X is a single substance selected from oxides, nitrides, fluorides and chlorides or a mixture of two or more thereof. The above oxides, nitrides, fluorides and chlorides may contain M, L, A or R. However, the nitride is a part of the raw material, not the whole material.

For example, when a Eu-activated $SrLi_3AlO_4$ phosphor is produced, it is preferable to form a raw material mixture using compounds containing europium oxide, nitride, or fluoride, strontium oxide, nitride, or fluoride, lithium oxide, nitride, or fluoride, and aluminum oxide, nitride, or fluoride. In addition, a composite metal composed of strontium and lithium, strontium and aluminum, aluminum and lithium, or strontium, lithium, and aluminum, an oxide, a carbonate, hydroxide, an oxynitride, a nitride, hydride, fluoride, or chloride may be used as a starting raw material. In particular, it is more preferable to use europium oxide, strontium oxide, lithium oxide, and lithium oxide aluminum.

In the method of producing a phosphor of the present invention, during calcining for synthesizing the phosphor of the present invention, a compound containing an element other than the elements constituting the phosphor, which produces a liquid phase at a temperature that is equal to or lower than the calcining temperature may be added and calcined. Since such a compound that produces a liquid phase acts as a flux and functions to promote a synthetic reaction and particle growth of the phosphor, a stable crystal is obtained, and the light emission intensity of the phosphor may be improved.

The compound that produces a liquid phase at a temperature that is equal to or lower than the calcining temperature includes one type of fluoride, chloride, iodide, bromide and phosphate including at least one type of element selected from Mg, Ca, Sr, Ba, Zn, Li, Na, K Al, Ga, B, In, Sc, Y, La and Si or a mixture of two or more thereof. Since these compounds have different melting points, they may be used according to the synthesis temperature. In the present invention, such compounds that produce a liquid phase are also included in the raw materials for convenience.

In order to produce the phosphor in the form of a powder or aggregate, the raw materials are preferably powders.

In addition, since the synthetic reaction of the phosphor occurs at a contact portion between raw material powder particles as a starting point, when the average particle size of the raw material powder is set to 500 μm or less, this is preferable because the contact portion of the raw material powder increases and the reactivity is improved.

(Mixing Method)

In the method of producing a phosphor of the present invention, a method of mixing raw materials to form a raw material mixture is not particularly limited, and a known mixing method is used. That is, in addition to a dry mixing method, mixing can be performed by a method in which wet mixing is performed in an inert solvent that does not substantially react with raw materials and the solvent is then removed. Here, regarding a mixing device, a V type mixer, a rocking mixer, a ball mill, a vibrating mill, or the like is preferably used.

(Calcining Container)

When the raw material mixture is calcined, various heat resistant materials may be used for a calcining container in which the raw material mixture is retained. For example, a boron nitride container formed of, for example, boron nitride sintered components, an alumina container formed of, for example, alumina sintered components, a carbon container formed of, for example, carbon sintered components, and a metal container formed of molybdenum, tungsten, or tantalum can be used.

(Calcining Temperature)

In the method of producing a phosphor of the present invention, the calcining temperature of the raw material mixture is 600° C. or higher and 1,500° C. or lower, and there is no other particular limitation. When the calcining temperature is lower than 600° C., crystal growth of the phosphor of the present invention is unlikely to proceed, and it is difficult to obtain suitable fluorescence characteristics. In addition, when the calcining temperature exceeds 1,500° C., this is not preferable because the phosphor of the present invention decomposes, and fluorescence characteristics deteriorate. Here, the calcining time varies depending on the calcining temperature, and is generally about 1 to 10 hours. Time patterns of heating, temperature maintaining, and cooling during calcining, and the numbers of times these patterns are repeated are not particularly limited, and raw materials may be added as necessary during calcining.

(Calcining Atmosphere)

In the method of producing a phosphor of the present invention, it is important to control the valence of Eu in order to obtain a sufficient light emission intensity, and it is preferable to perform calcining under a reducing environment in which Eu is reducible from the state of $Eu^{3+}$ to $Eu^{2+}$. Examples of reducing environments include an atmosphere in which an inert gas such as nitrogen or argon gas is filled into a graphite resistance heating type electric furnace in which a furnace material such as an insulating material and a heater is made of carbon, an atmosphere in which $H_2$ gas or a gas obtained by diluting $H_2$ gas with an inert gas such as nitrogen or argon gas is filled into an all-metal furnace in which a furnace material such as an insulating material and a heater is made of molybdenum or tungsten, an atmosphere in which $NH_3$ gas or a gas obtained by diluting $NH_3$ gas with an inert gas such as nitrogen or argon gas is filled into a furnace in which corrosion resistance is imparted to a furnace material such as an insulating material and a heater, and an atmosphere in which $CH_4$ gas or a gas obtained by diluting $CH_4$ gas with an inert gas such as nitrogen or argon gas is filled into a furnace in which corrosion resistance is imparted to a furnace material such as an insulating material and a heater. Regarding an atmosphere for obtaining a sufficient light emission intensity, an atmosphere filled with $H_2$ gas or $NH_3$ gas is preferable.

(Calcining Atmosphere)

Regarding the pressure range during calcining, a pressurized atmosphere within a suitable range is preferable because thermal decomposition of the raw material mixture and the phosphor as its product is minimized. Specifically, 0.1 MPa (atmospheric pressure) or more is preferable. In addition, an oxygen partial pressure in an atmosphere during calcining is preferably 0.0001% or less in order to prevent the raw materials and the phosphor from being oxidized during calcining.

(Phosphor, and Annealing Treatment after Calcining)

The phosphor obtained by calcining and phosphor powder obtained by crushing the phosphor, and also phosphor powder whose particle size has been adjusted can be subjected to a heat treatment at a temperature of 600° C. or higher and 1,300° C. or lower (also referred to as an annealing treatment). According to this operation, defects contained in the phosphor and damage due to crushing may be recovered from. The defects and damage may cause decrease in the light emission intensity, and the light emission intensity may be restored according to the heat treatment.

In addition, the phosphor after calcining or after the annealing treatment can be washed with a solvent or an acidic or basic solution. According to this operation, it is possible to reduce the content of the compound that produces a liquid phase at a temperature that is equal to or lower than the calcining temperature and an amount of the subphase. As a result, the light emission intensity of the phosphor may increase.

The average particle size of the finally obtained phosphor of the present invention is preferably 50 nm or more and 200 μm or less in terms of the volume-based median diameter (d50) because in this case the light emission intensity is high. The volume-based average particle size can be measured according to a laser diffraction and scattering method defined in JIS Z8825. The average particle size of the phosphor powder synthesized by calcining may be adjusted to a particle size of 50 nm or more and 200 μm or less using one or a plurality of methods selected from crushing, classification, and an acid treatment. More preferably, the particle size may be adjusted to 50 nm or more and 50 μm or less.

In this manner, the phosphor of the present invention can have a wide excitation range from radioactive rays and ultraviolet rays to visible light, can emit blue to red light, and particularly, can exhibit a blue color to a red color with 450 nm or more and 650 nm or less in a specific composition, and a light emission wavelength and a light emission peak width are able to be adjusted. Due to such light emission characteristics, the phosphor of the present invention is beneficial as a material forming a light-emitting element using the phosphor of the present invention or a phosphor plate including the phosphor of the present invention. In addition, a lighting instrument and an image display device using the light-emitting element, and the phosphor of the present invention are also suitable for a pigment and a UV absorbing agent. The phosphor of the present invention can be used alone and also, for example, a molded article such as a fluorescent molded article, a fluorescent sheet and a fluorescent film obtained by additionally molding a composition in which various materials containing the phosphor of the present invention, a resin, and the like are mixed can be provided. Here, the phosphor of the present invention has excellent heat resistance because it does not deteriorate even when exposed to a high temperature, and also has an advantage of excellent long-term stability under an oxidizing atmosphere and a wet environment, and can provide a product having excellent durability.

<3. Light-Emitting Element>

The phosphor of the present invention can be used in various applications, and a light-emitting element containing the phosphor of the present invention is also one aspect of the present invention. The form of the phosphor of the present invention contained in the light-emitting element may be a particle form or a form obtained by sintering the particle-like phosphor again. The particle-like phosphor that is sintered particularly into a flat form again may be called a phosphor plate. In addition, the light-emitting element here is generally composed of a phosphor and an excitation source for the phosphor.

When a light-emitting element that is generally called a light-emitting diode (also referred to as an LED) is formed using the phosphor of the present invention, for example, a form in which a phosphor-containing composition in which the phosphor of the present invention is dispersed in a resin and glass (these are collectively referred to as a solid medium) is disposed such that excitation light is irradiated to the phosphor from the excitation source is generally preferably used. In this case, a phosphor other than the phosphor of the present invention can also be contained in the phosphor-containing composition.

The resin that can be used as a solid medium of the phosphor-containing composition exhibits a liquid property before molding or when the phosphor is dispersed, and any resin can be selected depending on the purpose as long as it does not cause undesired reactions or the like for the phosphor and the light-emitting element of the present invention. Examples of resins include an addition reaction type silicone resin, a condensation reaction type silicone resin, a modified silicone resin, an epoxy resin, a polyvinyl resin, a polyethylene resin, a polypropylene resin, and a polyester resin. These resins may be used alone or two or more thereof may be used in any combination and ratio. When the resin is a thermosetting resin, it is cured to obtain a phosphor-containing composition in which the phosphor of the present invention is dispersed.

A proportion of the solid medium used is not particularly limited, and may be appropriately adjusted according to applications and the like.

Generally, a mass ratio of the solid medium to the phosphor of the present invention is in a range that is generally 3 mass % or more, and preferably 5 mass % or more, and generally 30 mass % or less, and preferably 15 mass % or less.

In addition, the phosphor-containing composition of the present invention may contain other components in addition to the phosphor of the present invention and the solid medium according to its application and the like. Examples of other components include a diffusing agent, a thickener, a thickening agent, and an interfering agent. Specific examples thereof include silica-based fine powder such as aerosol and alumina.

In addition, regarding the phosphor other than the phosphor of the present invention, at least one type of phosphor selected from BAM phosphors, β-sialon phosphors, α-sialon phosphors, $Sr_2Si_5N_8$ phosphors, $(Sr, Ba)_2Si_5N_8$ phosphors, $CaAlSiN_3$ phosphors, $(Ca, Sr)AlSiN_3$ phosphors, KSF phosphors, YAG phosphors, and $(Ca, Sr, Ba)Si_2O_2N_2$ may be further included.

Regarding one embodiment of the light-emitting element of the present invention, in addition to the phosphor of the present invention, a blue phosphor that emits light having a peak wavelength of 420 nm to 500 nm or less by a light emitter or a light source can be further included. Examples of such a blue phosphor include $AlN:(Eu, Si)$, $BaMgAl_{10}O_{17}:Eu$, $SrSi_9Al_{19}ON_{31}:Eu$, $LaSi_9Al_{19}N_{32}:Eu$, α-sialon:Ce, and JEM:Ce.

In addition, regarding one embodiment of the light-emitting device of the present invention, in addition to the phosphor of the present invention, a green phosphor that emits light having a peak wavelength of 500 nm or more and 550 nm or less by a light emitter or a light source can be included. Examples of such a green phosphor include β-sialon:Eu, $(Ba, Sr, Ca, Mg)_2SiO_4:Eu$, and $(Ca, Sr, Ba)Si_2O_2N_2:Eu$.

In addition, regarding one embodiment of the light-emitting device of the present invention, in addition to the phosphor of the present invention, a yellow phosphor that emits light having a peak wavelength of 550 nm or more and 600 nm or less by a light emitter or a light source can be further included. Examples of such a yellow phosphor include YAG:Ce, α-sialon:Eu, $CaAlSiN_3:Ce$, and $La_3Si_5N_{11}:Ce$.

In addition, regarding one embodiment of the light-emitting device of the present invention, in addition to the phosphor of the present invention, a red phosphor that emits light having a peak wavelength of 600 nm or more and 700 nm or less by a light emitter or a light source can be further included. Examples of such a red phosphor include $CaAlSiN_3:Eu$, $(Ca, Sr)AlSiN_3:Eu$, $Ca_2Si_5N_8:Eu$, and $Sr_2Si_5N_8:Eu$.

When the phosphor of the present invention in the form of a phosphor plate is contained in the light-emitting element of the present invention, the phosphor plate is obtained by molding a particle-like phosphor of the present invention into a desired form and then heating and sintering it. However, the phosphor plate of the present invention may contain a phosphor other than the phosphor of the present invention and other components. Examples of other components here include glass as a medium, a binder resin, a dispersant, and a sintering aid. Additives such as a binder resin, a dispersant, and a sintering aid are not particularly limited, but substances known in the field that are generally decomposed and removed at the same time during heating and sintering can be preferably used.

The average particle size of phosphor particles used when the phosphor plate is produced is not particularly limited, but the addition amount of the binder resin that imparts moldability is adjusted according to a specific surface area of the phosphor particles, and for example, particles having an average particle size of 0.1 μm or more and 30 μm or less can be preferably used.

The phosphor plate can be produced by a known method. For example, additives such as a binder resin, a dispersant, and a sintering aid are added to the powder phosphor of the present invention, and a dispersion medium is additionally added, the mixture is wet and mixed, the viscosity of the obtained slurry is adjusted to form a sheet shape, a disk shape or the like, and this is heated and calcined to decompose and remove the additives, and thus a phosphor sheet of the present invention can be obtained. The heating and calcining temperature, the time, and the calcining atmosphere may be appropriately changed to known conditions depending on materials used. In addition, a method in which glass powder having a lower melting point than the phosphor of the present invention is added and molded, and then calcined to produce a phosphor plate is also effective.

The excitation source included in the light-emitting element of the present invention is, for example, a light source that emits excitation energy which allows the phosphor of the present invention or other phosphors to be excited and to emit light. The phosphor of the present invention emits light when vacuum ultraviolet rays of 100 to 190 nm, ultraviolet rays of 190 to 380 nm, electron rays, or the like are irradiated. However, examples of preferable excitation sources include a blue semiconductor light emitting element. The phosphor of the present invention emits light according to light from the excitation source and functions as a light-emitting element. Here, the light-emitting element of the present invention need not be a single element and may be an integrated element in which a plurality of light-emitting elements are combined.

Regarding one embodiment of the light-emitting element of the present invention, there is a light-emitting element in which a light emitter or a light source emits ultraviolet or visible light having a peak wavelength of 300 to 500 nm, and preferably 300 to 470 nm, and blue light-yellow green light-red light (for example, 435 nm-570 nm-750 nm) that is emitted from the phosphor of the present invention and light having a wavelength of 450 nm or more that is emitted from other phosphor of the present invention are mixed and thus white light or non-white light is emitted.

Here, it should be noted that the above embodiment of the light-emitting element is only an example, and in addition to the phosphor of the present invention, a blue phosphor, a green phosphor, a yellow phosphor or a red phosphor is appropriately combined, and thus white light having a desired color tone can be obtained.

In addition, regarding one embodiment of the light-emitting element of the present invention, when an LED in which a light emitter or light source emits light having a wavelength of 280 to 500 nm is used, the light emission efficiency is high and thus a light-emitting device with high efficiency can be formed.

Here, light from the excitation source used is not particularly limited to monochromatic light, and may be multicolored light.

Figure 5:
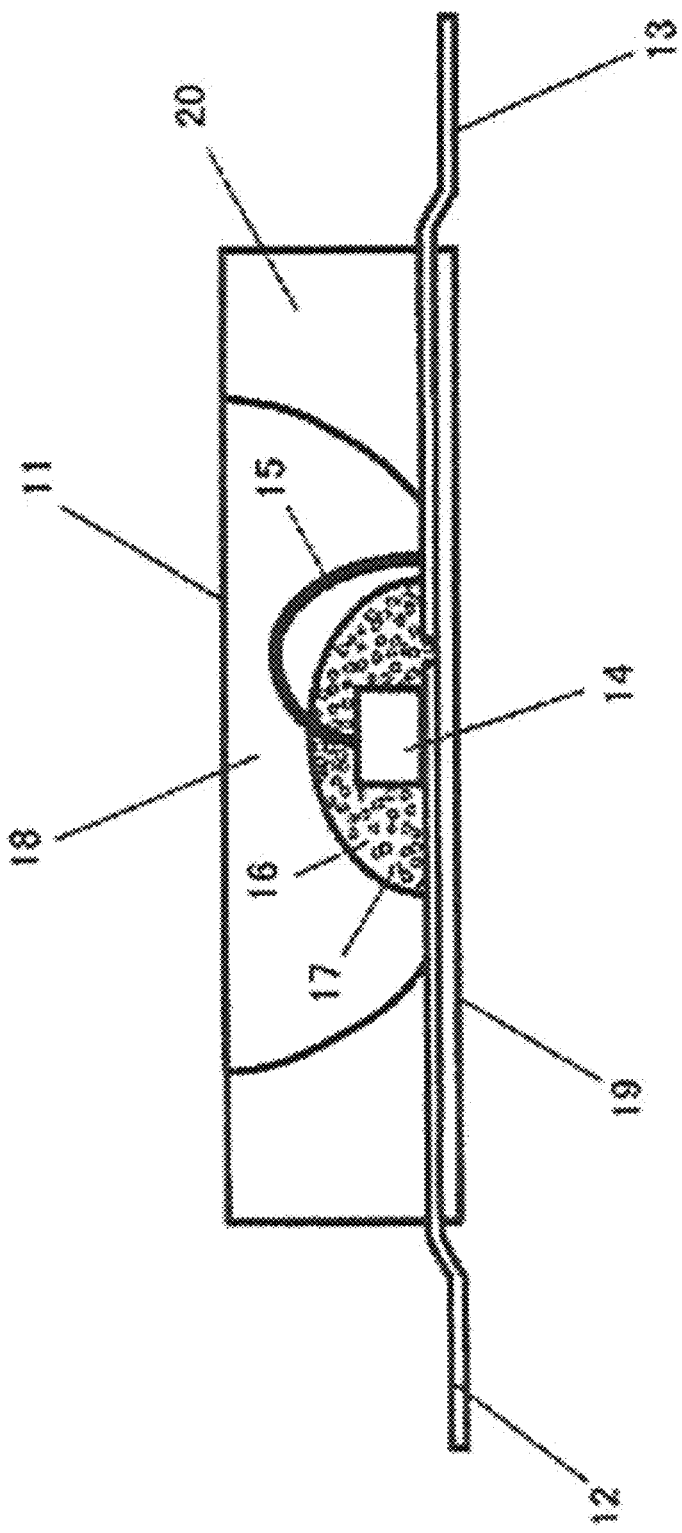
FIG. 5 is a schematic diagram of a surface mounting type LED element using a phosphor of the present invention.

FIG. 5 schematically shows a light-emitting element (surface mounting type LED) according to the present invention.

A surface mounting type white light-emitting diode lamp 11 is produced. Two lead wires 12 and 13 are fixed to a white alumina ceramics substrate 19 having a high visible light reflectance, one ends of these wires are positioned substantially in the central part of the substrate, and the other ends are exposed to the outside and become an electrode that is soldered when mounted on an electrical substrate. A blue light-emitting diode element 14 having a light emission peak wavelength of 450 nm is mounted and fixed to one end of one lead wire 12 between the lead wires so that it becomes the central part of the substrate. A lower electrode of the blue light-emitting diode element 14 and a lower lead wire are electrically connected using a conductive paste, and an upper electrode and the other lead wire 13 are electrically connected using a bonding wire 15 made of a gold wire.

A mixture of a first resin 16 and a phosphor 17 prepared by mixing a yellow phosphor produced in Example 1 is mounted near the light-emitting diode element. The first resin in which the phosphor is dispersed is transparent and covers the entire blue light-emitting diode element 14. In addition, a wall member 20 having a shape with a hole at its central part is fixed on a ceramic substrate. The central part of the wall member 20 forms a hole for accommodating the blue light-emitting diode element 14 and a resin 16 in which the phosphor 17 is dispersed, and a part facing the center becomes an inclined surface. The inclined surface is a reflection surface for extracting light forward and a curved shape of the inclined surface is determined in consideration of a light reflection direction. In addition, at least the surface constituting the reflection surface is a surface having white or metallic luster and having a high visible light reflectance. In the light-emitting element, the wall member 20 is made of a white silicone resin. The hole at the central part of the wall member forms a recess as a final shape of a chip type light-emitting diode lamp, but here is filled with a transparent second resin 18 such that all of the blue light-emitting diode element 14 and the first resin 16 in which the phosphor 17 is dispersed are sealed. In the light-emitting element, the same epoxy resin can be used for the first resin 16 and the second resin 18. The light-emitting element emits white light.

<4. Light-Emitting Device>

In addition, a light-emitting device including the light-emitting element of the present invention is also one aspect of the present invention. Specific examples of light-emitting devices include a lighting instrument, a liquid crystal panel backlight, and various display instruments.

<5. Image Display Device>

In addition, an image display device including the light-emitting element of the present invention is also one aspect of the present invention. Specific examples of image display devices include a vacuum-fluorescent display (VFD), a field emission display (FED), a plasma display panel (PDF), a cathode ray tube (CRT), and a liquid crystal display (LCD).

<6. Pigment>

The phosphor of the present invention can be used, for example, as material forming a pigment, using its function. That is, when the phosphor of the present invention is irradiated with sun light or light from a fluorescent lamp, a white object color is observed, but the color development is favorable, and it does not deteriorate for a long time, and thus the phosphor of the present invention can be suitable for, for example, an inorganic pigment. Therefore, when the phosphor is used as a pigment that is added to paints, inks, dyes, glazes, or plastic products, it is possible to maintain favorable white with a high degree for a long time.

<7. UV Absorbing Agent>

The phosphor of the present invention can be used not only alone but also used as, for example, a material forming a UV absorbing agent, using its function. That is, for example, when the UV absorbing agent containing the phosphor of the present invention is kneaded into a plastic product or a paint, or applied to a surface of a plastic product, they can be effectively protected from ultraviolet deterioration.

<8. Phosphor Sheet>

Preferable use examples of the phosphor of the present invention include a composition in which the phosphor of the present invention is mixed with, for example, a resin, and a phosphor molded article, a phosphor film, and a phosphor sheet obtained by additionally molding the composition. For example, the phosphor sheet of the present invention here is a sheet containing the phosphor of the present invention that is uniformly dispersed in a medium. The material of the medium is not particularly limited, and a transparent material is preferable, it is a material that can maintain the shape in a sheet form, and examples thereof include a resin. Specific examples thereof include a silicone resin, an epoxy resin, a polyarylate resin, a PET modified polyarylate resin, a polycarbonate resin, a cyclic olefin, a polyethylene terephthalate resin, a polymethylmethacrylate resin, a polypropylene resin, a modified acrylic, a polystyrene resin and an acrylonitrile-styrene copolymer resin. In the phosphor sheet of the present invention, a silicone resin or an epoxy resin is preferably used in consideration of transparency. In consideration of the heat resistance, a silicone resin is preferably used.

As necessary, additives can be added to the phosphor sheet of the present invention. For example, an adhesive auxiliary agent such as a silane coupling agent may be added as a leveling agent during film formation if necessary during film formation, a dispersant for promoting dispersion of a phosphor, and a sheet surface modifying agent. In addition, inorganic particles such as silicone fine particles may be added as a phosphor sedimentation inhibitor.

The film thickness of the phosphor sheet of the present invention is not particularly limited, and may be determined based on the phosphor content and desired optical characteristics. In consideration of the phosphor content, workability, optical characteristics, and heat resistance, the film thickness is, for example, preferably 10 μm or more and 3 mm or less, and more preferably 50 μm or more and 1 mm or less.

A method of producing a phosphor sheet of the present invention is not particularly limited, and known methods can be used. Here, the phosphor sheet of the present invention need only contain the phosphor of the present invention, and may be a single-layer sheet or a multi-layer sheet, and it is not necessary that the entire sheet be uniform. A base material layer can be provided on one surface or both surfaces of the sheet or inside thereof. The material of the base material layer is not particularly limited, and for example, a known metal, a film, glass, a ceramic, paper, and the like can be used. Specific examples thereof include metal plates or foils of aluminum (also including an aluminum alloy), zinc, copper, and iron, plastic films of cellulose acetate, polyethylene terephthalate (PET), polyethylene, polyester, polyamide, polyimide, polyphenylene sulfide, polystyrene, polypropylene, polycarbonate, polyvinyl acetal, and aramid, and paper in which the plastic is laminated or paper coated with the plastic, paper in which the metal is laminated or deposited, and a plastic film in which the metal is laminated or deposited. In addition, when the base material is a metal plate, the surface may be subjected to a plating treatment or a ceramic treatment with chromium or nickel. In particular, the base material preferably has a flexible film form having high strength. Therefore, for example, a resin film is preferable, and specific examples thereof include a PET film and a polyimide film.

EXAMPLES

While the present invention will be described in more detail with reference to the following examples, these are disclosed simply as an aid for easy understanding of the present invention, and the present invention is not limited to these examples.

Reference Example

A crystal represented by $M_\alpha(L, A)_\beta X_\gamma$, or $SrLi_3AlO_4$ which was a crystal having the same crystal structure as a phosphor host crystal represented by $SrLi_3AlO_4$ excluding the crystal represented by $M_\alpha(L, A)_\beta X_\gamma$ and was a reference of the phosphor host crystal was synthesized and used as a reference example. Next, the crystal structure of the obtained $SrLi_3AlO_4$ of the reference example was analyzed, and it was first confirmed that this was a novel substance that had not been found before. It was used as a reference for comparison with crystal structures of phosphor host crystals of phosphors synthesized in Examples 1 and 2.

<Raw Materials>

Regarding raw materials of $SrLi_3AlO_4$ in the reference example, an aluminum (TAIMICRON, commercially available from Taimei Chemicals Co., Ltd.) powder, a strontium oxide (SrO, commercially available from Kojundo Chemical Lab. Co., Ltd.) powder, a lithium oxide ($Li_2O$, commercially available from Kojundo Chemical Lab. Co., Ltd.) powder, a lithium aluminate ($LiAlO_2$, commercially available from Kojundo Chemical Lab. Co., Ltd.) powder, and an europium oxide ($Eu_2O_3$, purity of 99.9% commercially available from Shin-Etsu Chemical Co., Ltd.) powder were used.

The above strontium oxide (SrO), lithium oxide ($Li_2O$), and lithium aluminate ($LiAlO_2$) were weighed out so that atomic ratio (Sr:Li:Al) of Sr, Li and Al was 1:3:1 in a glove box filled with a dry inert gas. Mixing was performed using a pestle made of silicon nitride sintered components and a mortar for 10 minutes. Then, the obtained raw material mixed powder was filled into a crucible made of boron nitride sintered components.

The crucible filled with raw material mixed powder was set in a graphite resistance heating type electric furnace. A calcining procedure for the mixed powder was as follows. First, a calcining atmosphere was once set to a reduced pressure state of $1 \times 10^{-1}$ Pa or less using a diffusion pump, heating was performed from room temperature to 200° C. at a rate of 5° C./min, nitrogen gas having a purity of 99.999 volume % was introduced at 200° C., the pressure in the furnace was set to 0.90 MPa, and while the pressure in the furnace was maintained, the temperature was raised to 800° C. at a rate of 10° C./min, and the temperature was maintained for 4 hours. Then, control of the pressure in the furnace was released and the temperature was lowered to room temperature.

The calcined raw material mixed powder (also referred to as a "synthetic component" in this specification) was extracted from the crucible, and crushed using a pestle made of silicon nitride sintered components and a mortar into a powder form. When this powder synthetic component was subjected to elemental analysis through inductively coupled plasma (ICP) atomic emission spectrophotometry, it was confirmed that the atomic ratio (analysis value) of Sr, Li, and Al was 1.0:3.0:1.0, and there was no change in the composition before and after calcining.

The powder synthetic component was observed under an optical microscope, and crystal particles with a size of 8 μm×6 μm×4 μm were collected, and fixed to the tip of a glass fiber with an organic adhesive. Using a single crystal X-ray diffractometer with a rotating anticathode for MoKα rays (SMART APEXII Ultra, commercially available from Bruker AXS), X-ray diffraction measurement was performed thereon under conditions of an output of 50 kV and 50 mA of an X-ray source. As a result, it was confirmed that the crystal particles were single crystals.

The crystal structure was determined from the X-ray diffraction measurement results using single crystal structure analysis software (APEX2, commercially available from Bruker AXS). The obtained crystal structure data is shown in Table 1. In addition, FIG. 1 shows the crystal structure. Table 1 shows the crystal type, the space group, the lattice constants, the type of atom, and the atom position. Using the data, it was possible to determine the shape of the unit lattice, and arrangement of atoms in the lattice.

The crystal is a triclinic type (Triclinic) crystal and has the space group P-1, (the $2^{nd}$ space group in International Tables for Crystallography), and the lattice constants a, b, and c and angles α, β, and γ were as follows:
a=0.5752 nm
b=0.7341 nm
c=0.9738 nm
α=83.930 degrees
β=76.693 degrees
γ=79.660 degrees The atom positions were as shown in Table 1. Sr and O existed at independent atom positions, but Li and Al existed at an arbitrary ratio at the same atom position so that the atomic ratio of Li and Al in the entire crystal was 3:1.

Based on the crystal structure data shown in Table 1, it was confirmed that the $SrLi_3AlO_4$ crystal was a novel substance that had not been reported before. In addition, the powder X-ray diffraction pattern was calculated from the crystal structure data. FIG. 2 shows a powder X-ray diffraction using CuKα rays calculated from the crystal structure of the $SrLi_3AlO_4$ crystal. Then, the powder X-ray diffraction of the synthetic component was measured. When the measured powder X-ray diffraction pattern was the same as that in FIG. 2, it was determined that the $SrLi_3AlO_4$ crystal shown in FIG. 1 was generated.

In addition, regarding the $SrLi_3AlO_4$ crystal, a crystal having the same crystal structure as an $SrLi_3AlO_4$ crystal, excluding the $SrLi_3AlO_4$ crystal, was examined. It was found that, while maintaining the crystal structure of the $SrLi_3AlO_4$ crystal, some or all of Sr could be replaced with Mg, Ca, Ba and Zn. That is, the crystal $ALi_3AlO_4$ (A is one type or two types selected from Mg, Ca, Ba and Zn, or a mixture thereof) had the same crystal structure as an $SrLi_3AlO_4$ crystal. In addition, it was confirmed that the crystal was one composition having a crystal in which some of Li could be replaced with Al, and some or all of Al could be replaced with Ga and Si, and having the same crystal structure as $SrLi_3AlO_4$.

In addition, regarding the $SrLi_3AlO_4$ crystal, a crystal having the same crystal structure as an $SrLi_3AlO_4$ crystal, excluding the $SrLi_3AlO_4$ crystal, was examined. It was confirmed that, in the $SrLi_3AlO_4$ crystal, in order to maintain electrical neutrality of the entire crystal, a ratio of Li and Al was controlled, and thus some of O could be replaced with N.

This crystal can be described as a composition represented by composition formula: $Sr_{1-r}Li_{3-q}Al_{1+q}O_{4-2q}N_{2q}Eu_r$,
(where, in the composition formula,
0≤q<2.0, and
0<r<1.0).

Regarding a crystal having changed lattice constants and the like while maintaining a crystal structure as an $SrLi_3AlO_4$ crystal, a powder X-ray diffraction pattern could be calculated from the values of the lattice constants obtained according to powder X-ray diffraction measurement and the crystal structure data in Table 1. Therefore, it was possible to determine whether the crystal was an $SrLi_3AlO_4$ crystal by comparing the calculated powder X-ray diffraction pattern with the measured powder X-ray diffraction pattern.

Examples 1 and 2 and Comparative Example 1

According to the design composition (atomic ratio) of Examples 1 and 2 and Comparative Example 1 shown in the following Table 2, the powder raw materials were weighed out in a glove box filled with a dry inert gas so that the raw material mixture composition (mass ratio) in the following Table 3 was obtained.

The weighed raw material mixed powders were mixed using a pestle made of silicon nitride sintered components and a mortar for 10 minutes. Then, the mixed powder was filled into a crucible made of boron nitride sintered components.

TABLE 2

| Example | Elemental R | Sr | Elemental A | | | | Elemental B | Elemental C | | | Elemental X | |
|---|---|---|---|---|---|---|---|---|---|---|---|---|
| | | | Mg | Ca | Ba | Zn | Li | Al | Ga | Si | O | N |
| Comparative Example 1 | — | — | 1.00 | — | — | — | 3.0 | 1.0 | — | — | 4.0 | — |
| Example 1 | Eu 0.01 | 0.99 | — | — | — | — | 3.0 | 1.0 | — | — | 4.0 | — |
| Example 2 | Eu 0.01 | 0.99 | — | — | — | — | 3.0 | 1.0 | — | — | 4.0 | — |

TABLE 3

| | Mixing composition of raw materials (mass ratio) | | | | | | | | | | | |
|---|---|---|---|---|---|---|---|---|---|---|---|---|
| Example | SrO | MgO | CaO | BaO | ZnO | $1/2Li_2O$ | $LiAlO_2$ | $1/2Al_2O_3$ | $1/2Ge_2O_3$ | $SiO_2$ | $1/2Eu_2O_3$ | $CeO_2$ |
| Comparative Example 1 | 51.96 | — | — | — | — | 14.98 | 33.06 | — | — | — | — | — |
| Example 1 | 51.51 | — | — | — | — | 14.85 | 32.77 | — | — | — | 0.87 | — |
| Example 2 | 51.51 | — | — | — | — | 22.28 | — | 25.34 | — | — | 0.87 | — |

The crucible filled with raw material mixed powder was set in a graphite resistance heating type electric furnace. A calcining procedure for the mixed powder was as follows.

First, a calcining atmosphere was once set to a reduced pressure state of $1\times10^{-1}$ Pa or less using a diffusion pump, heating was performed from room temperature to 200° C. at a rate of 5° C./min, nitrogen gas having a purity of 99.999 volume % was introduced at 200° C., the inside of the furnace was set to a predetermined pressure, and while the pressure in the furnace was maintained, the temperature was raised to a predetermined temperature at a rate of 10° C./min, and the temperature was maintained for a predetermined time. Then, control of the pressure in the furnace was released and the temperature was lowered to room temperature. Here, the calcining temperature, the pressure, and the calcining time were values described in the calcining conditions in the following Table 4.

TABLE 4

| Example | | Calcining conditions | | |
| --- | --- | --- | --- | --- |
| | | Temperature (° C.) | Atmosphere pressure (MPa) | Time (hour) |
| Comparative Example | 1 | 800 | 0.90 | 4.0 |
| Example | 1 | 800 | 0.90 | 4.0 |
| Example | 2 | 800 | 0.90 | 4.0 |

The calcined component was extracted from the crucible and crushed using a pestle made of silicon nitride sintered components and a mortar, and passed through a 45 μm mesh sieve. The particle size distribution was measured, and the average particle size d50 was 3 to 8 μm. When the powder synthetic component was subjected to elemental analysis through inductively coupled plasma (ICP) atomic emission spectrophotometry, it was confirmed that the atomic ratio (analysis value) of Sr, Li, and Al was 1.0:3.0:1.0, and there was no change in the composition before and after calcining.

Figure 3:
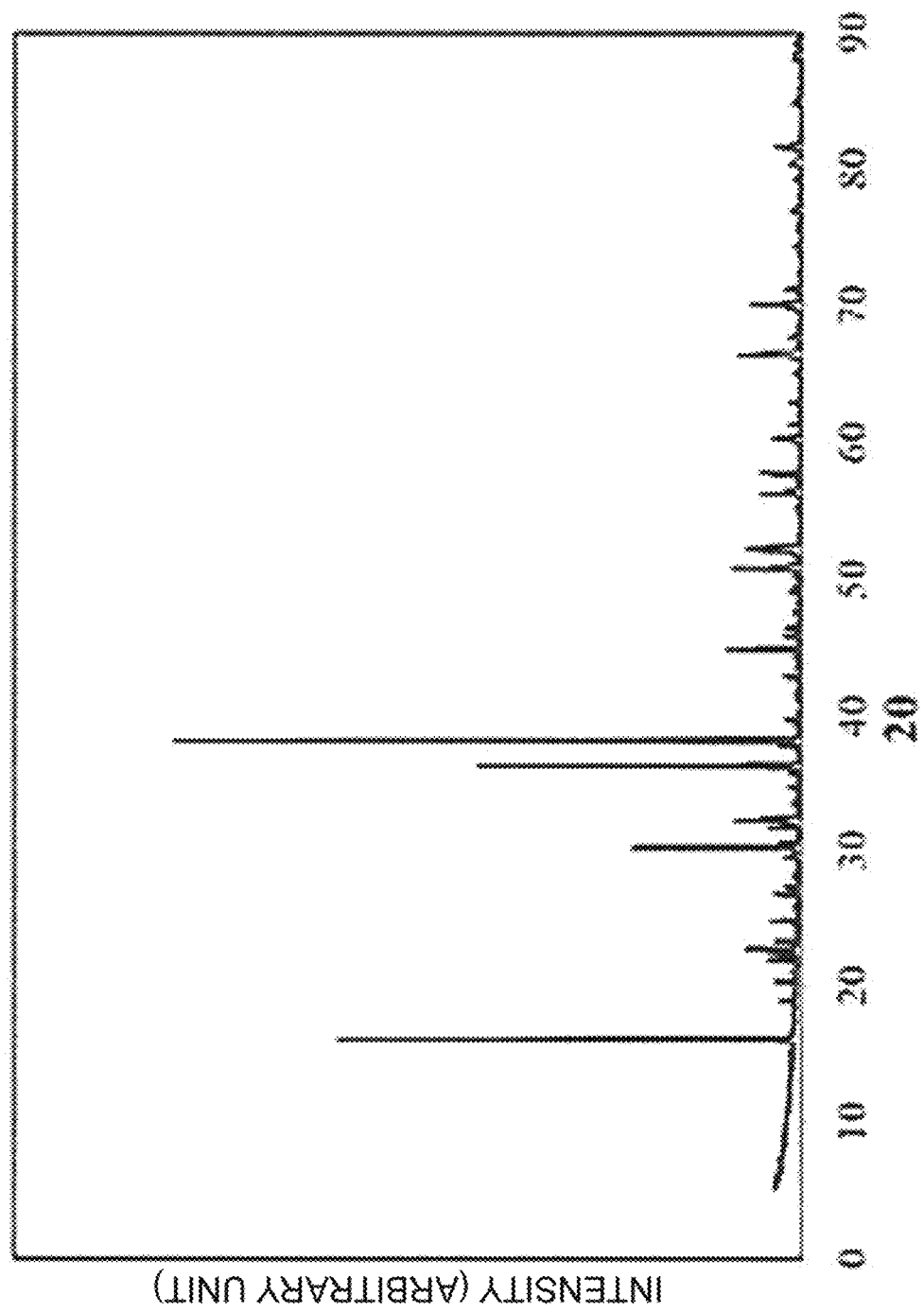
FIG. 3 is a diagram showing powder X-ray diffraction results of a synthetic component synthesized in Example 1.

The powder X-ray diffraction using Kα rays of Cu was measured. FIG. 3 shows powder X-ray diffraction results of the synthetic component of Example 1.

It was confirmed that the powder X-ray diffraction pattern of the synthetic component in FIG. 3 showed favorable agreement with the powder X-ray pattern calculated from the $SrLi_3AlO_4$ crystal shown in FIG. 2, and the crystal had the same crystal structure as an $SrLi_3AlO_4$ crystal.

For example, peaks of 2θ=15.94 degrees, 38.04 degrees, 36.22 degrees, 30.14 degrees, 22.64 degrees, 44.70 degrees, 66.26 degrees, 69.92 degrees, 32.20 degrees, and 57.54 degrees in FIG. 2 almost corresponded to peaks of 2θ=16.00 degrees, 38.12 degrees, 36.30 degrees, 30.22 degrees, 22.72 degrees, 44.78 degrees, 66.38 degrees, 70.08 degrees, 32.28 degrees, and 57.72 degrees in FIG. 3 even though there were some inversions in the height of the intensity, and they were in favorable agreement. Here, the error of an angle of 2θ was estimated to be ±1 degree.

Based on the above, it was confirmed that the synthetic component of Example 1 was an inorganic compound in which Eu was solid-solutionized in the $SrLi_3AlO_4$ crystal. Although not shown, the same X-ray diffraction pattern was also obtained in Example 2. The results of the correspondence of the X-ray diffraction pattern in Example 2 and the main peak in FIG. 2 examined in respective 10 main peaks were the same.

As described above, it was confirmed that the synthetic component of the example of the present invention contained, as a main component, an inorganic compound in which Eu activating ions were solid-solutionized in the $SrLi_3AlO_4$ crystal.

Figure 4:
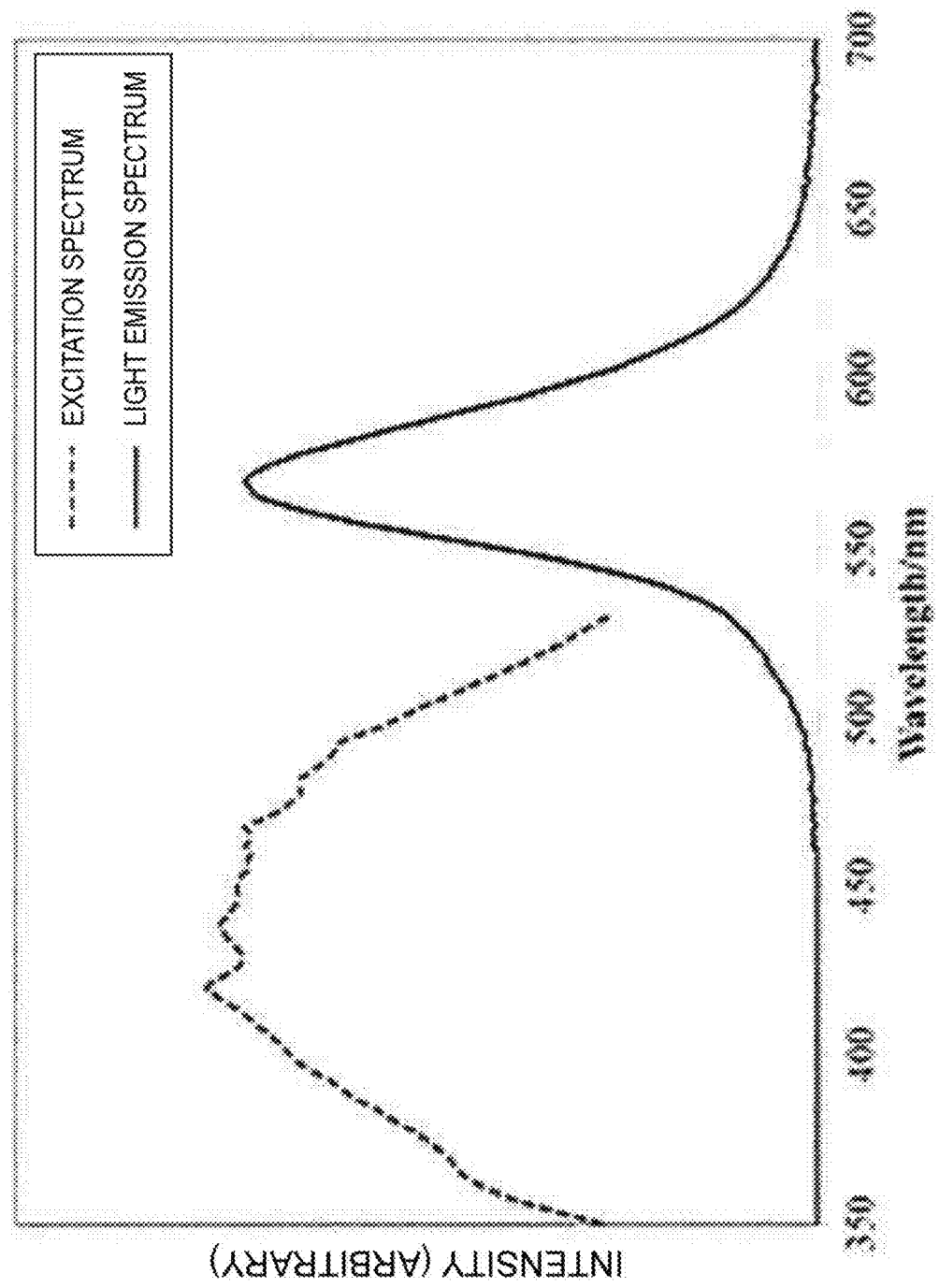
FIG. 4 is a diagram showing an excitation spectrum and a light emission spectrum of the synthetic component synthesized in Example 1.

The light emission spectrum and the excitation spectrum of these powders were measured using a fluorescence spectrophotometer. FIG. 4 shows the excitation spectrum and the light emission spectrum of the synthetic component synthesized in Example 1. The following Table 5 shows the peak wavelength of the excitation spectrum, the peak wavelength of the light emission spectrum, the full width at half maximum of the light emission spectrum, and the intensity (light emission intensity) of the light emission spectrum when excited at 450 nm. In the table, the light emission intensity is a value normalized such that the value in Example 1 is 100.

TABLE 5

| Example | | Excitation peak wavelength (nm) | Light emission wavelength (nm) | Full width at half maximum (nm) | Light emission intensity (arbitrary unit) |
| --- | --- | --- | --- | --- | --- |
| Comparative Example | 1 | N/A | N/A | N/A | No light emission |
| Example | 1 | 422 | 569 | 47 | 100 |
| Example | 2 | 422 | 569 | 47 | 100 |

With reference to FIG. 4, it was found that the synthetic component of Example 1 could be excited at 422 nm with highest efficiency, and the light emission spectrum when excited at 422 nm was a yellow light emission spectrum having a peak at 569 nm and a full width at half maximum of 47 nm. In addition, it was confirmed that the light emission color of the synthetic component of Example 1 was within ranges of 0≤x≤0.8 and 0≤y≤0.9 in CIE 1931 chromaticity coordinates.

In addition, based on Table 5, it was confirmed that the synthetic component of the present invention was a phosphor that could be efficiently excited with purple or blue light of 380 nm to 450 nm, and emit yellow light.

As described above, it was found that the synthetic component of the example of the present invention was a novel phosphor in which activating ions of Eu as R were solid-solutionized in the $SrLi_3AlO_4$ crystal.

REFERENCE SIGNS LIST

1 Oxygen atom
2 Strontium atom
3 $AlO_4$ tetrahedron (central Al atom)
4 $LiO_4$ tetrahedron (central Li atom)
11 Surface mounting type white light-emitting diode lamp
12, 13 Lead wire
14 Blue light-emitting diode element
15 Bonding wire
16 First resin
17 Phosphor
18 Second resin
19 Alumina ceramics substrate
20 Wall member

The invention claimed is:

1. A phosphor in which an element represented by $R_\delta$ is solid-solutionized in a phosphor host crystal represented by $M_\alpha(L, A)_\beta X_\gamma$,
wherein,
M is at least one type of element selected from Mg, Ca, Sr, Ba and Zn,
L is at least one type of element selected from Li, Na and K, A is at least one type of element selected from Al, Ga, B, In, Sc, Y, La and Si, X is at least one type of element selected from O, N, F and Cl (where all of X being N is excluded), R is at least one type of element selected from Mn, Cr, Ti, Ce, Pr, Nd, Sm, Eu, Tb, Dy, Ho and Yb, and $\alpha$, $\beta$, $\gamma$ and $\delta$ satisfy $\alpha+\beta+\gamma+\delta=9$, $0.00<\alpha\leq1.30$, $3.70\leq\beta\leq4.30$, $3.70\leq\gamma\leq4.30$, and $0.00<\delta\leq1.30$ wherein the phosphor host crystal is a triclinic type crystal and has space group P-1 symmetry, wherein lattice constants a, b and c of the phosphor host crystal are values in ranges:

a=0.5752±0.05 nm, b=0.7341±0.05 nm, and c=0.9738±0.05 nm.

2. The phosphor according to claim 1, wherein, in the phosphor host crystal,

M is at least one type of element selected from Mg, Ca, Sr, Ba and Zn, some or all of L is elemental Li, some or all of A is at least one type of element selected from Al, Ga and Si, X is one type or two types of elements selected from O and N, where all of X being N is excluded, and R is at least one type of element selected from Mn, Cr, Ti, Ce, Pr, Nd, Sm, Eu, Tb, Dy, Ho and Yb.

3. The phosphor according to claim 1, wherein the phosphor host crystal is represented by any of the following composition formulae:

$SrLi_{3-p}Al_{1+p}O_{4-2p}N_{2p}$, $MgLi_{3-p}Al_{1+p}O_{4-2p}N_{2p}$, $CaLi_{3-p}Al_{1+p}O_{4-2p}N_{2p}$, $BaLi_{3-p}Al_{1+p}O_{4-2p}N_{2p}$, $(Ca,Mg)Li_{3-p}Al_{1+p}O_{4-2p}N_{2p}$, $(Sr,Ca)Li_{3-p}Al_{1+p}O_{4-2p}N_{2p}$, $(Sr,Ba)Li_{3-p}Al_{1+p}O_{4-2p}N_{2p}$, $SrLi_{3-p}Ga_{1+p}O_{4-2p}N_{2p}$, $MgLi_{3-p}Ga_{1+p}O_{4-2p}N_{2p}$, $CaLi_{3-p}Ga_{1+p}O_{4-2p}N_{2p}$ and $BaLi_{3-p}Ga_{1+p}Ga_{1+p}O_{4-2p}N_{2p}$ (where, $0\leq p<2.0$).

4. The phosphor according to claim 1, wherein the phosphor is represented by a composition formula $Sr_eLi_fAl_gO_{h1}N_{h2}R_i$, compositional proportions e, f, g, h1, h2 and i satisfy e+f+g+h1+h2+i=9, $0.00<e\leq1.30$, $0.70\leq f\leq3.30$, $3.70\leq h1+h2\leq4.30$ (where, h1>0), and $0.00<i\leq1.30$.

5. The phosphor according to claim 4, wherein the compositional proportions e, f, g, h1 and h2 satisfy e+i=1.00±0.30, f+g=4.00±0.30, and h1+h2=4.00±0.30 (where, h1>0).

6. The phosphor according to claim 4, wherein the compositional proportions f and g satisfy $\frac{1}{4}\leq g/(f+g)<\frac{3}{4}$.

7. The phosphor according to claim 4, wherein the compositional proportions h1 and h2 satisfy $0<h1/(h1+h2)\leq1$.

8. The phosphor according to claim 1, wherein, when light having a light intensity peak in a wavelength range of 250 nm or more and 500 nm or less is irradiated, the phosphor emits fluorescence having a light intensity peak in a wavelength range of 430 nm or more and 670 nm or less.

9. The phosphor according to claim 1, wherein, when light having a light intensity peak in a wavelength range of 250 nm or more and 500 nm or less is irradiated, the phosphor emits fluorescence having a light intensity peak in a wavelength range of 560 nm or more and 580 nm or less.

10. The phosphor according to claim 1, wherein the elements represented by R comprise Eu.

11. The phosphor according to claim 1, wherein the phosphor is represented by a composition formula $Sr_{1-r}Li_{3-q}Al_{a+q}O_{4-2q}N_{2q}Eu_r$, parameters q and r satisfy $0\leq q<2.0$, and $0<r<1.0$.

12. The phosphor according to claim 11, wherein the parameters q and r satisfy q=0, and $0<r<0.05$.

13. A light-emitting element comprising the phosphor according to claim 1.

14. A light-emitting device using the light-emitting element according to claim 13.

15. An image display device using the light-emitting element according to claim 13.

* * * * *